United States Patent
Wu

(10) Patent No.: US 6,741,111 B1
(45) Date of Patent: May 25, 2004

(54) DATA REGISTER FOR BUFFERING DOUBLE-DATA-RATE DRAMS WITH REDUCED DATA-INPUT-PATH POWER CONSUMPTION

(75) Inventor: Ke Wu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/249,581

(22) Filed: Apr. 21, 2003

(51) Int. Cl.[7] .................................................. H03K 3/12
(52) U.S. Cl. ........................ 327/199; 327/200; 327/201; 327/217
(58) Field of Search ................................ 327/199, 200, 327/201, 212, 214, 215, 217, 218, 224, 225; 365/189.05, 233, 233.5

(56) References Cited

U.S. PATENT DOCUMENTS

| | | | |
|---|---|---|---|
| 3,764,989 A | 10/1973 | McClellan | 702/57 |
| 4,539,587 A | 9/1985 | Eby et al. | 348/138 |
| 4,744,063 A | 5/1988 | Ohtani et al. | 365/233 |
| 4,962,487 A | 10/1990 | Suzuki | 365/233.5 |
| 5,189,647 A | 2/1993 | Suzuki et al. | 368/10 |
| 5,404,327 A | 4/1995 | Houston | 365/203 |
| 5,566,130 A | 10/1996 | Durham et al. | 365/233.5 |
| 6,049,846 A | 4/2000 | Farmwald et al. | 710/305 |
| 6,204,707 B1 | 3/2001 | Hamada et al. | 327/202 |
| 6,304,506 B1 | 10/2001 | Huang et al. | 365/205 |
| 6,404,233 B1 | 6/2002 | Blomgren et al. | 326/93 |
| 6,424,590 B1 | 7/2002 | Taruishi et al. | 365/230.08 |

*Primary Examiner*—Timothy P. Callahan
*Assistant Examiner*—An T. Luu
(74) *Attorney, Agent, or Firm*—Stuart T. Auvinen

(57) ABSTRACT

A buffer chip clocks data to memories on a memory module. The data-input path to registers or flip-flops on the buffer chip are speeded up by removing muxes on the inputs to the flip-flops. Speeding up the data-input path allows power dissipation to be reduced, since smaller input buffers can be used. Control logic combines chip-select and data-strobe control inputs that prevent clocking of the flip-flops. The control logic outputs a combined strobe signal. Set-reset latches are triggered by the combined strobe signal. The set-reset latches allow the clock to pass through to the flip-flop when the chip-select and data-strobe inputs are both active. The set-reset latches block a rising transition of chip-select and data-strobe inputs from changing the clocks to the flip-flop, thus preventing data-clocking errors.

20 Claims, 4 Drawing Sheets

DATA REGISTER FOR BUFFERING DOUBLE-DATA-RATE DRAMS WITH REDUCED DATA-INPUT-PATH POWER CONSUMPTION

BACKGROUND OF INVENTION

This invention relates to integrated circuits, and more particularly to differential buffer chips.

Memory modules are widely used in electronic systems such as personal computers. Various standards are used, such as those by the Joint Electronic Device Engineering Council (JEDEC). Some JEDEC standards use double-data-rate (DDR) dynamic-random-access memory (DRAM) chips on modules known as dual-inline-memory-modules (DIMMs). Differential input signals are used for faster signaling.

Very high-speed buffer chips are needed for interfacing with the DDR DRAM's. Each data line, and perhaps some address or control signals are buffered. Bi-directional data lines can be supported by using two uni-directional data-buffer slices in parallel but in reverse directions.

FIG. 1 shows a bit-slice for a data buffer chip that interfaces with DDR DRAMs. Data input D(N) is one of 25 or so data lines input to a buffer chip. Data input D(N) is compared to a reference voltage Vref by differential buffer 16, then muxed by mux 22 before being applied to the D-input of flip-flop 20. The Q(N) output of flip-flop 20 is a latched data bit that can be applied to one of the DDR DRAM's data inputs.

Vref is a reference voltage such as Vcc/2. Differential buffers 12, 14 also receive Vref. Differential buffer 12 compares data strobe input DCS to Vref while differential buffer 14 compares chip-select input CSR to Vref. NAND gate 24 combines the outputs of differential buffers 12, 14 and drives the control input to mux 22 through inverter 18.

When both DCS and CSR are high (above Vref), mux 22 selects the upper input, recycling the Q(N) output back to the D(N) input of flip-flop 20. When either of DCS or CSR pulse low, below Vref, mux 22 selects its lower input, and the data input D(N) is latched into flip-flop 20 on the next clock edge.

Clock buffer 26 receives a differential clock ICK and ICKB, and generates a clock edge to flip-flop 20 when the differential clock signals cross-over. Reset signal RST can be applied to differential buffers 12, 14, 16, clock buffer 26, and flip-flop 20.

While such a data buffer is useful, a propagation delay occurs for the data through mux 22. This delay tends to increase the data setup time, the amount of time that data input D(N) must arrive before the clock edge of ICK, ICKB to be safely latched into flip-flop 20. Since a tight setup time is specified by the JEDEC standard, the data-path delay may have to be reduced, such as by using a high-speed differential buffer 16. However, increasing the speed of differential buffer 16 requires a large current, which increases power consumption. Since there can be as many as 25 bit slices such as shown in FIG. 1 in a buffer chip, a large overall power consumption can occur. Such large power consumptions are undesirable.

What is desired is a buffer chip with lower power dissipation. A faster data input path to the flip-flop is desirable without relying on large-current differential input buffers.

DETAILED DESCRIPTION

The present invention relates to an improvement in buffer chips. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that data-input-path delays can be reduced if the mux can be eliminated. Since the mux is in the critical path, removal if the mux can reduce propagation delays and allow for a smaller differential input buffer to be used for the data input. The smaller differential buffer can result is a significant power reduction since one differential buffer is need for each of the 25 or so data input slices.

Figure 1:
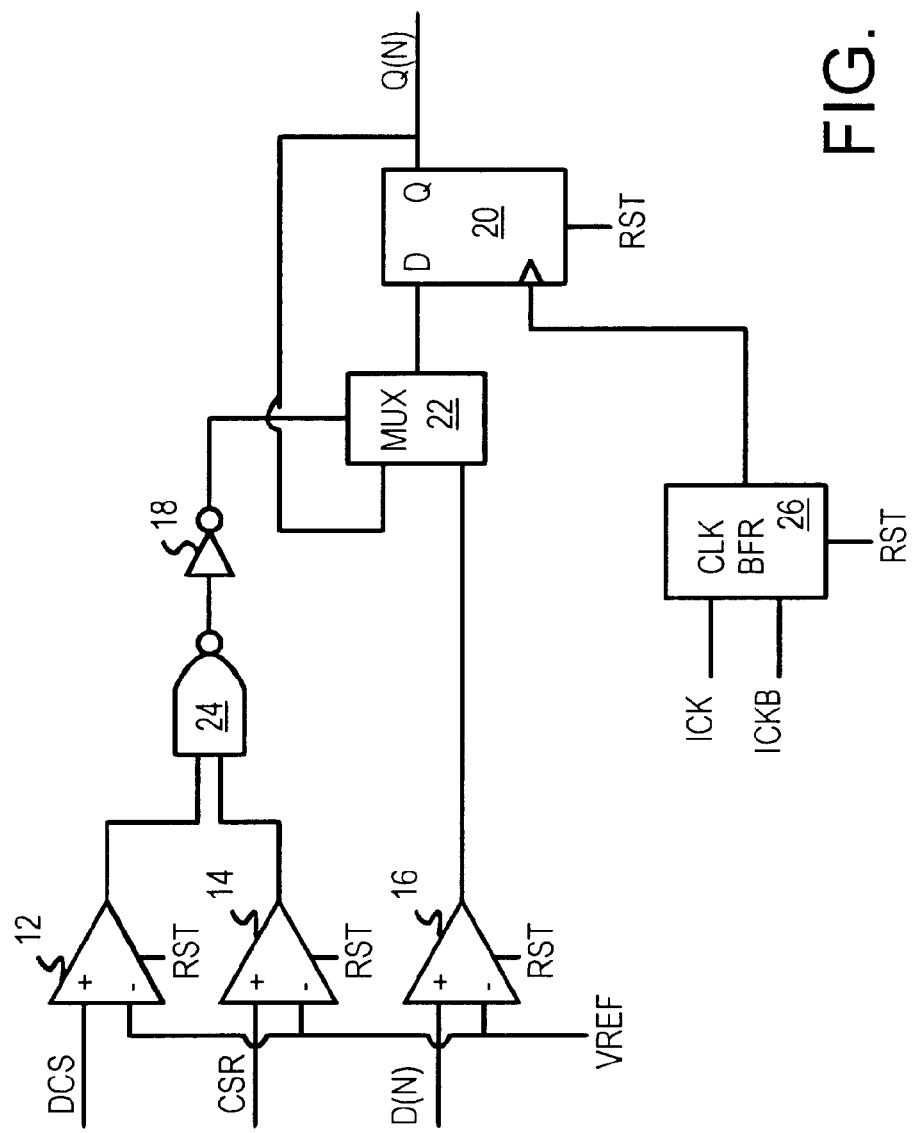
FIG. 1 shows a bit-slice for a data buffer chip that interfaces with DDR DRAMs.
Figure 2:
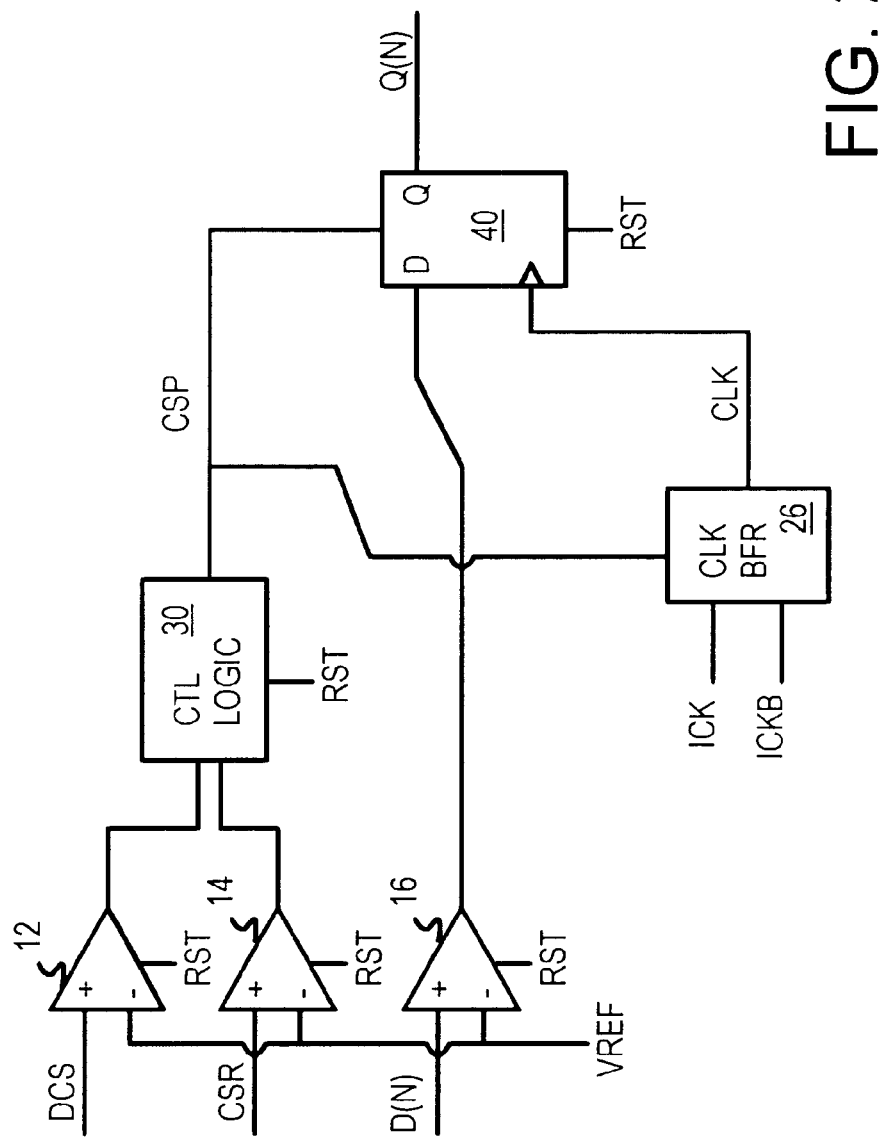
FIG. 2 shows a bit slice of a buffer chip with a reduced data-path delay by removal of the data mux.

FIG. 2 shows a bit slice of a buffer chip with a reduced data-path delay by removal of the data mux. Differential input buffers 12, 14, 16 compare DCS, CSR, and data input D(N) to reference voltage Vref. The output of differential buffer 16 is directly applied to the D input of flip-flop 40, eliminating the mux delay of FIG. 1. Clock buffer 26 generates a clock edge to flip-flop 40 when differential clock signals ICK, ICKB cross-over.

Control logic 30 receives the outputs of differential buffer 12, 14, and generates chip-select pulse CSP. CSP is driven Control logic 30 drives CSP low when both DCS and CSR are high, or when reset RST is high. Additional mode logic may be included in control logic 30, such as for interleaving of for bank selection.

Chip-select pulse CSP is applied to clock buffer 26 and to flip-flop 40. Chip-select pulse CSP can gate the clock buffer to reduce power consumption. Reset signal RST is applied to flip-flop 40, control logic 30, and differential buffers 12, 14, 16.

Figure 3:
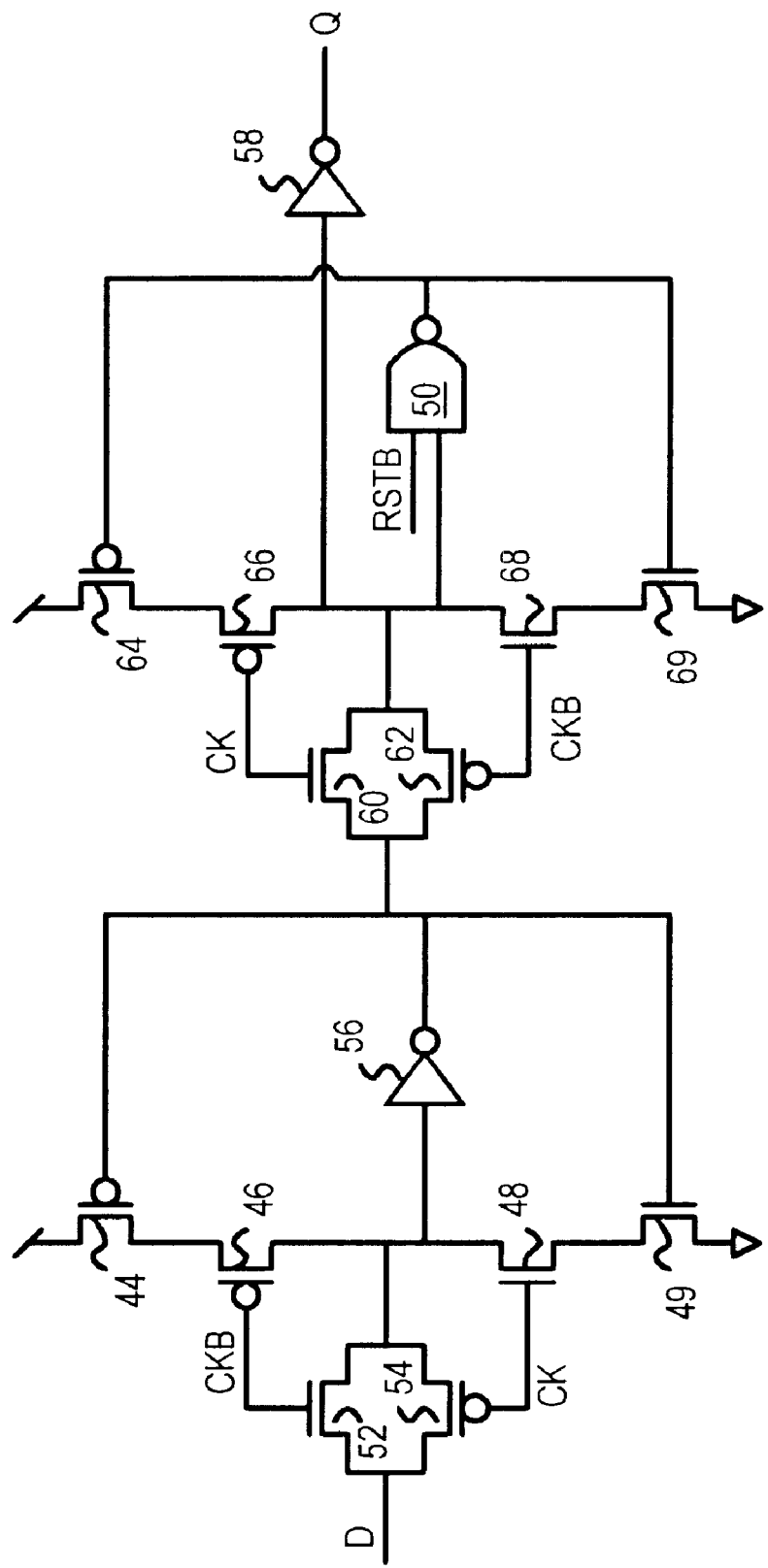
FIG. 3 shows the data path of the flip-flop in the data path.

FIG. 3 shows the data path of the flip-flop in the data path. Flip-flop 40 receives the data signal D output by differential buffer 16 of FIG. 2 and generates output Q as Q(N). A true and complement clock, CK, CKB, and a reset signal RST, are also input.

Data signal D passes through a first transmission gate of p-channel transistor 54, which receives CK at its gate, and n-channel transistor 52, which receives CKB at its gate. The first transmission gate is open when CK is low. The other side of the first transmission gate drives the input of inverter 56, which feeds its output back to the gates of p-channel feedback transistor 44 and n-channel feedback transistor 49. Clock signal CKB is applied to the gate of p-channel clock transistor 46, which is in series between p-channel feedback transistor 44 and the input of inverter 56. Clock signal CK is applied to the gate of n-channel clock transistor 48, which is in series between n-channel feedback transistor 49 and the input of inverter 56. Transistors 44, 46, 48, 49 are in series and form a clocked inverter.

The output of inverter 56 drives the input of a second transmission gate of n-channel transistor 60, which receives CK at its gate, and p-channel transistor 62, which receives CKB at its gate. The second transmission gate is open when CK is high. On the rising edge of CK, data from the master stage is passed through the second transmission gate to the slave stage.

The other side of the second transmission gate drives an input of NAND gate 50, which feeds its output back to the gates of p-channel feedback transistor 64 and n-channel feedback transistor 69. Clock signal CK is applied to the gate of p-channel clock transistor 66, which is in series between p-channel feedback transistor 64 and an input of NAND gate 50. Clock signal CKB is applied to the gate of n-channel clock transistor 68, which is in series between n-channel feedback transistor 69 and the input of NAND gate 50. Transistors 64, 66, 68, 69 are in series and form a second clocked inverter.

The other input of NAND gate 50 is the reset signal RSTB. RSTB is driven low to force high the output of flip-flop 40. This Q output can later be inverted.

Inverter 58 has its input coupled to the drains of transistors 66, 68 and the output of the second transmission gate. Inverter 58 drives the final output Q of flip-flop-40.

Figure 4:
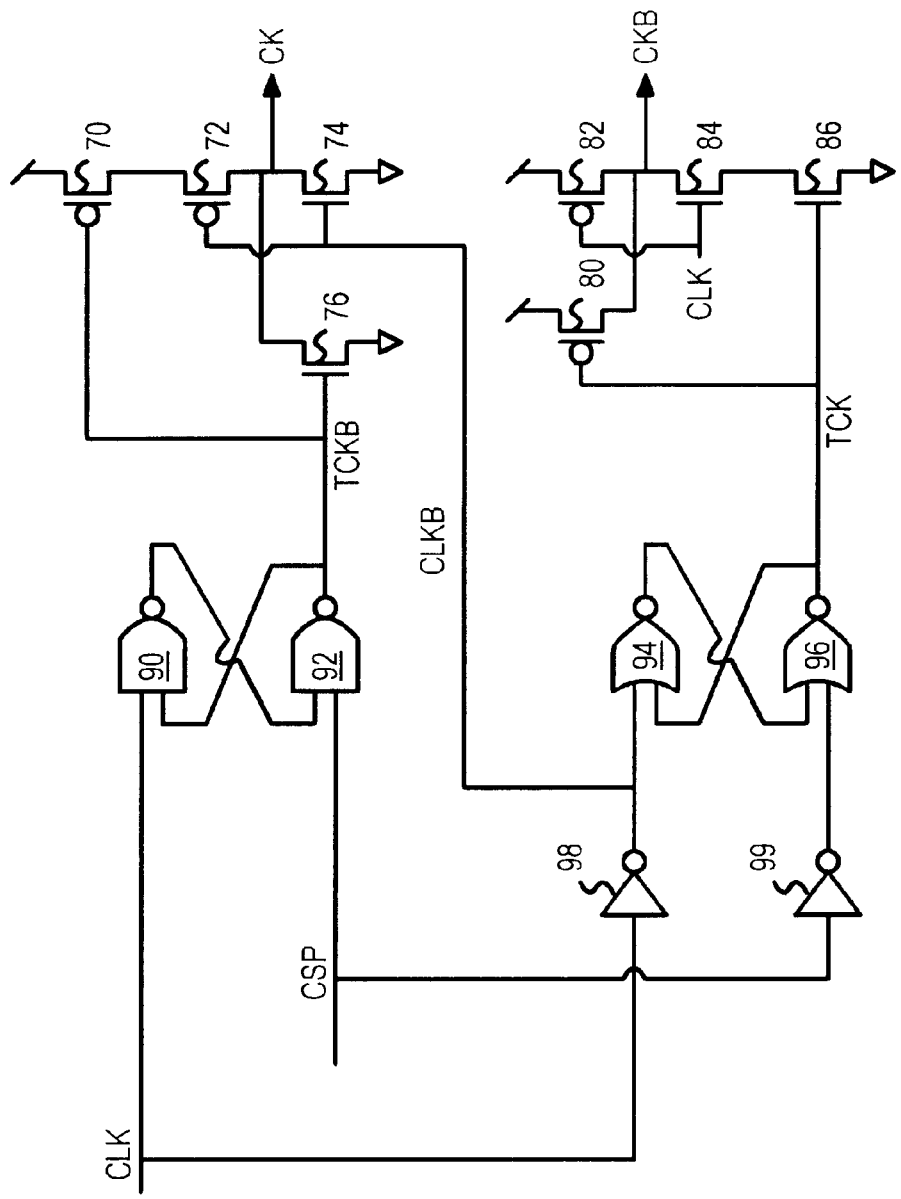
FIG. 4 is a schematic of a clock-locking circuit for the flip-flop in the reduced data path.

FIG. 4 is a schematic of a clock-locking circuit for the flip-flop in the reduced data path. NAND gates 90, 92 form a S-R latch receiving CLK, CSP, that drives TCKB, while NOR gates 94, 96 form another S-R latch receiving inverses of CLK, CSP that drives TCK. CK is driven high through p-channel transistors 70, 72 when both TCKB and CLKB are low, or otherwise driven low by either of n-channel transistors 74, 76. CKB is driven low by n-channel transistors 84, 86 when both TCK and CLK are high, or otherwise driven high by either of p-channel transistors 80, 82.

When chip-select pulse CSP is low, the clock is blocked. Flip-flop 40 remains in its last state, even with the clock CLK from clock buffer 26 (FIG. 2) changes. When CSP is low, NAND gate 92 drives TCLKB high regardless of CLK. This turns on n-channel transistor 76, which holds CK low.

Also when CSP is low, inverter 99 drives high the lower input of NOR gate 96, which drives TCLK low regardless of CLKB. This turns on p-channel transistor 80, which holds CKB high.

When chip-select pulse CSP is high, clock-locking circuit 40' allows clock CLK to propagate CK, CKB to the data latches of FIG. 3. The high CSP causes NAND gate 92 to act as an inverter, and through inverter 99 causes NOR gate 96 to also act as an inverter. If CLK is low, then TCKB is low and TCK is high, so CKB is high and CK is low. Then when CLK goes high, TCKB goes high and TCK goes low, causing CKB to go low and CK to go high.

If CLK is high, then TCKB is high and TCK is low, so CKB is low and CK is high. Then when CLK goes low, TCKB goes low and TCK goes high, causing CKB to go high and CK to go low.

When chip-select pulse CSP goes from low to high, flip-flop 40 must not latch new data D. Instead, the old data Q must be maintained. Without using the data-path mux, data can be held by preventing a rising clock edge on CK when CSP goes high and CLK is already high.

When CLK is low and CSP goes from low to high, NAND gate 90 continues to output a 1, allowing TCKB to go low, turning on p-channel transistor 70. However, since CLKB is high, the state of CK does not change but remains low. NOR gate 94 continues to output a low since CLKB is high, so CSP drives TCK high through NOR gate 96. N-channel transistor 86 is turned on, but n-channel transistor 84 remains off since CLK is low. Thus the rising transition of CSP is blocked from changing CK, CKB.

When CLK is high and CSP goes from low to high, the prior low of CSP causes NAND gate 92 to drive a high to NAND gate 90, which has both inputs high and outputs a low back to NAND gate 92. This feedback low blocks changes on CSP from being propagated to TCKB and CK.

The prior low of CSP causes inverter 99 to drive a high to NOR gate 96, which drives a low to NOR gate 94. Since CLK is high, inverter 98 drives a second low to the inputs of NOR gate 94. The output of NOR gate 94 is high, and is driven back to NOR gate 96, blocking CSP from propagating through to TCK, CKB. Thus whether CLK is high or low, a rising transition of CSP is blocked from changing CK, CKB.

By eliminating the mux in the data-input path, the data differential buffer can be reduced in size significantly while still meeting the setup time spec. Simulation has shown power reductions of as much as 48%.

ALTERNATE EMBODIMENTS

Several other embodiments are contemplated by the inventor. For example, different buffering, gating, and logic may be substituted. Buffering could be added to the outputs of the NAND and NOR gates driving CK and CKB, or these gates can be replaced with other logic such as transmission gates and buffers or switch networks. Rather than input a single-ended clock to the flip-flop, a differential clock could be directly used by the flip-flop. Signals can be active high or active low.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A buffer chip comprising:

a data-strobe input for a data-strobe signal;

a chip-select input for a chip-select signal;

a clock;

combining logic, receiving the data-strobe signal and the chip-select signal, for generating a combined strobe signal;

a first set-reset latch, receiving the clock and the combined strobe signal, for generating a first triggered clock signal in response to the clock, but for blocking clock pulses on the first triggered clock signal when the combined strobe signal is in an inactive state;

a first clock gate, receiving the clock and the first triggered clock signal, for generating a true clock;

a second set-reset latch, receiving the clock and the combined strobe signal, for generating a second triggered clock signal in response to the clock, but for blocking clock pulses on the second triggered clock signal when the combined strobe signal is in the inactive state;

a second clock gate, receiving the clock and the second triggered clock signal, for generating a complement clock;

a data input buffer that receives an external data input signal and generates an internal data signal; and a flip-flop, responsive to the true and complement clocks, having a data input coupled directly to the data input signal from the data input buffer, the flip-flop clocking the data input signal when the combined strobe signal is in an active state, but not clocking the data input signal when the combined strobe signal is in the inactive state, whereby data is clocked when the combined strobe signal is in the active state, but not clocked when the combined strobe signal is in the inactive state.

2. The buffer chip of claim 1 wherein the second set-reset latch further comprises:

a first inverter, receiving the clock, for generating an inverse clock;

a second inverter, receiving the combined strobe signal, for generating an inverse strobe signal;

a pair of cross-coupled logic gates including a first logic gate that receives the inverse clock and a second logic gate that receives the inverse strobe signal.

3. The buffer chip of claim 2 wherein the first clock gate receives the inverse clock signal.

4. The buffer chip of claim 3 wherein the first logic gate and the second logic gates are NOR gates.

5. The buffer chip of claim 4 wherein the first set-reset latch further comprises:

a pair of cross-coupled logic gates including a third logic gate that receives the clock and a fourth logic gate that receives the combined strobe signal.

6. The buffer chip of claim 5 wherein the third logic gate and the fourth logic gates are NAND gates.

7. The buffer chip of claim 6 wherein the first clock gate is a NOR gate and the second clock gate is a NAND gate.

8. The buffer chip of claim 7 wherein the data input buffer is a differential buffer that receives a pair of differential data lines.

9. The buffer chip of claim 8 wherein the combining logic further receives a reset input, wherein the combined strobe signal is in the inactive state when the reset input is activated.

10. The buffer chip of claim 7 wherein the flip-flop comprises:

a master stage, receiving the internal data signal, and clocked by the complement clock;

a slave stage, coupled to an output of the master stage, and clocked by the true clock.

11. The buffer chip of claim 10 further comprising:

a plurality of the data input buffers receiving a plurality of data signals and driving a plurality of flip-flops with a plurality of internal data lines.

12. A data register comprising:

a first input buffer receiving a data-strobe input;

a second input buffer receiving a chip-select input; combining logic, coupled to the first and second input buffers, for generating a combined strobe signal that is inactive when either the data-strobe input or the chip-select input is in an inactive state;

a plurality of data input buffers, each data input buffer receiving a pair of differential data signals and outputting an internal data signal;

a plurality of flip-flops, each having a data input that receives an internal data signal from one of the plurality of data input buffers, each flip-flop clocking its internal data signal in response to a true clock and a complement clock;

false-trigger prevention logic that comprises:

a clock inverter that receives a clock and generates an inverse clock;

a first S-R latch, receiving the clock and the combined strobe signal, for passing clock pulses of the clock to a first clock signal when the combined strobe signal is not in the inactive state;

a first gate, receiving the first clock signal and the inverse clock, for pulsing the true clock when the combined strobe signal is not in the inactive state;

a second S-R latch, receiving the inverse clock and an inverse of the combined strobe signal, for passing clock pulses of the inverse clock to a second clock signal when the combined strobe signal is not in the inactive state; and a second gate, receiving the second clock signal and the inverse clock, for pulsing the complement clock when the combined strobe signal is not in the inactive state, whereby clock pulses are blocked by the false-trigger prevention logic when either the data-strobe input or the chip-select input is in an inactive state.

13. The data register of claim 12 wherein the first gate is a NOR gate and the second gate is a NAND gate, and wherein the first S-R latch comprises cross-coupled NAND gates and the second S-R latch comprises cross-coupled NOR gates.

14. The data register of claim 13 wherein the plurality of flip-flops generate data outputs that are coupled to data inputs of dynamic-random-access memory (DRAM) chips when the data register is on a memory module containing the DRAM chips.

15. The data register of claim 14 wherein the DRAM chips are double-data-rate DDR DRAMs.

16. The data register of claim 15 wherein the first and second input buffers are differential input buffers each receiving a pair of signal lines, whereby differential control inputs are received.

17. A registered buffer chip comprising:

a data-strobe input for a data-strobe signal;

a chip-select input for a chip-select signal;

a clock;

combining logic means, receiving the data-strobe signal and the chip-select signal, for generating a combined strobe signal;

first set-reset latch means, receiving the clock and the combined strobe signal, for generating a first triggered clock signal in response to the clock, but for blocking clock pulses on the first triggered clock signal when the combined strobe signal is in an inactive state;

first clock gate means, receiving the clock and the first triggered clock signal, for generating a true clock;

second set-reset latch means, receiving the clock and the combined strobe signal, for generating a second triggered clock signal in response to the clock, but for blocking clock pulses on the second triggered clock signal when the combined strobe signal is in the inactive state;

second clock gate means, receiving the clock and the second triggered clock signal, for generating a complement clock;

data input buffer means, receiving an external data input signal, for generating an internal data signal; and flip-flop means, responsive to the true and complement clocks, having a data input coupled directly to the data input signal from the data input buffer, for clocking the data input signal when the combined strobe signal is in an active state, but not clocking the data input signal when the combined strobe signal is in the inactive state, whereby data is clocked when the combined strobe signal is in the active state, but not clocked when the combined strobe signal is in the inactive state.

18. The registered buffer chip of claim 17 wherein the flip-flop means comprises:

master stage means for clocking the internal data signal with the complement clock;

slave stage means, coupled to an output of the master stage means, for clocking with the true clock.

19. The registered buffer chip of claim 18 wherein the first set-reset latch means further comprises:

first cross-coupled logic means for blocking clock pulses in response to the combined strobe signal being in the inactive state, the first cross-coupled logic means receiving the clock and the combined strobe signal.

20. The registered buffer chip of claim 19 wherein the second set-reset latch means further comprises:

first inverter means, receiving the clock, for generating an inverse clock;

second inverter means, receiving the combined strobe signal, for generating an inverse strobe signal;

second cross-coupled logic means for blocking clock pulses in response to the combined strobe signal being in the inactive state, the second cross-coupled logic means receiving the inverse clock and the inverse strobe signal.

\* \* \* \* \*